United States Patent
Montgomery et al.

(10) Patent No.: US 7,468,227 B2
(45) Date of Patent: Dec. 23, 2008

(54) METHOD OF REDUCING THE AVERAGE PROCESS BIAS DURING PRODUCTION OF A RETICLE

(75) Inventors: Melvin Warren Montgomery, Camas, WA (US); Alexander Buxbaum, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 860 days.

(21) Appl. No.: 10/989,976

(22) Filed: Nov. 16, 2004

(65) Prior Publication Data

US 2006/0105248 A1    May 18, 2006

(51) Int. Cl.
*G03F 9/00* (2006.01)
*G03F 7/004* (2006.01)

(52) U.S. Cl. ......................... 430/5; 430/270.1; 430/291; 430/296; 430/321; 430/942

(58) Field of Classification Search .................. 430/5, 430/270.1, 291, 296, 321, 942
See application file for complete search history.

(56) References Cited

U.S. PATENT DOCUMENTS

| | | | |
|---|---|---|---|
| 5,356,758 A | 10/1994 | Orvek | 430/322 |
| 5,427,649 A | 6/1995 | Kim et al. | 156/661.11 |
| 6,258,514 B1 | 7/2001 | Montgomery | 430/315 |
| 6,342,562 B1 | 1/2002 | Kozawa et al. | 524/588 |
| 6,541,077 B1 | 4/2003 | Kozawa et al. | 427/503 |
| 6,586,156 B2 | 7/2003 | Angelopoulos et al. | 430/270.1 |
| 6,605,394 B2 | 8/2003 | Montgomery et al. | 430/5 |
| 6,620,575 B2 | 9/2003 | Kim et al. | 430/314 |
| 6,641,971 B2 | 11/2003 | Huang et al. | 430/189 |
| 6,703,169 B2 | 3/2004 | Fuller et al. | 430/5 |
| 2002/0120058 A1 | 8/2002 | Kozawa et al. | 524/588 |
| 2002/0197556 A1 | 12/2002 | Huang et al. | 430/270.1 |
| 2003/0049561 A1 | 3/2003 | Angelopoulos et al. | 430/270.1 |
| 2004/0063003 A1 | 4/2004 | Montgomery et al. | 430/5 |
| 2005/0186515 A1* | 8/2005 | Watkins | 430/322 |

FOREIGN PATENT DOCUMENTS

JP    2001297970    10/2001

OTHER PUBLICATIONS

A. Kornblit et al., "Role of pattern fidelity in the printing of optical proximity corrected photomasks", J. Vac. Sci. Technol. B, vol. 13, No. 6, pp. 2944-2948 (Nov./Dec. 1995).

(Continued)

*Primary Examiner*—John S Chu
(74) *Attorney, Agent, or Firm*—Shirley L. Church (57) ABSTRACT

We are able to reduce the average process bias in a patterned reticle by treating the developed, patterned photoresist which is used to transfer a pattern to the reticle with a silicon-containing reagent prior to the pattern transfer. The process bias is a measure of the difference between a nominal feature critical dimension (CD) produced in a patterned reticle and the nominal isofocal CD for the feature. Improvement of the average process bias is directly related to an improved resolution in the mask features. The reduction in average process bias achievable using the method of the invention typically ranges from about 30% to about 70%. This reduction in average process bias enables the printing of smaller features.

18 Claims, 3 Drawing Sheets

OTHER PUBLICATIONS

R. Kris et al., "Corner Roundness and Contact Area algorithms for Reticle Metrology through the use of Region Connectivity Extraction", Proceedings of SPIE, vol. 5256 (2003).

J. Muñoz et al., "Dry development of photosensitive polyimides for high resolution and aspect ratio applications", J. Vac. Sci. Technol. B., vol. 13, No. 6, pp. 2179-2183 (Nov./Dec. 1995).

J. Ochsenhirt et al., "Optimization of the e-beam sensitive bilayer CARL process for stencil mask making", 16th European Conference on Mask Technology for Integrated Circuits and Microcomponents, Proceedings of SPIE, vol. 3996, pp. 80-89 (2000).

C. Sauer et al., "Evaluation of commercial and experimental resist materials for use in MEBES® mask making", Proceedings of SPIE, vol. 2621, pp. 52-61 (1985).

I. Yonekura et al., "Pattern Shape Analysis Tool for Quantitative Estimate of Photomask and Process", Photomask and Next-Generation Lithography Mask Technology VIII, Proceedings of SPIE, vol. 4409, pp. 204-211 (2001).

* cited by examiner

METHOD OF REDUCING THE AVERAGE PROCESS BIAS DURING PRODUCTION OF A RETICLE

CROSS REFERENCE TO RELATED APPLICATIONS

This application is related to U.S. application Ser. No. 10/261,972, filed Sep. 30, 2002, titled: "Method of Producing A Patterned Photoresist Used To Prepare High Performance Photomasks", which is currently pending. This application is also related to U.S. Pat. No. 6,605,394 issued Aug. 12, 2003, titled: "Organic Bottom Antireflective Coating For High Performance Mask Making". This application is also related to U.S. Pat. No. 6,703,169, issued Mar. 9, 2004, titled: "Method Of Preparing Optically Imaged High Performance Photomasks".

BACKGROUND OF THE INVENTION

1. Field of the Invention

In general, the present invention relates to a method of producing a lithographic mask (reticle) for use in the semiconductor industry. In particular, the invention pertains to a method of producing a patterned photoresist used in preparation of the reticle. The optical imaging of the photoresist makes use of a deep ultraviolet (DUV) radiation. The DUV photoresist is imaged using an optical direct write continuous laser mask writing tool.

2. Brief Description of the Background Art

Photoresist compositions are used in microlithographic processes for making miniaturized electronic components, such as in the fabrication of semiconductor device structures. The miniaturized electronic device structure patterns are typically created by transferring a pattern from a patterned masking layer overlying the semiconductor substrate. The pattern is typically created in the semiconductor substrate masking layer by a process which includes blanket radiation through a reticle to produce an image of the pattern in the semiconductor substrate masking layer. A reticle is a patterned mask which is used in combination with an optical imaging tool to produce the pattern in the semiconductor substrate patterned masking layer. Blanket irradiation through a reticle is used to pattern the semiconductor substrate rather than direct writing of radiation upon the semiconductor substrate masking layer because of the time economy which can be achieved by blanket irradiation of the pattern through a reticle. A direct write process typically requires from about 8 hours to about 20 hours, while blanket irradiation through a reticle typically requires less than a minute, and often seconds. With regard to semiconductor device processing, the semiconductor substrate masking layer may be a patterned photoresist layer or may be a patterned "hard" masking layer (typically an inorganic material or a high temperature organic material) which resides on the surface of the semiconductor device structure to be patterned.

A reticle typically includes a thin metal-containing layer (such as a chrome-containing, molybdenum-containing, or tungsten-containing material, for example) deposited on a glass or quartz plate. The reticle is patterned to contain a "hard copy" of the individual device structure pattern to be recreated on the semiconductor substrate masking layer overlying the semiconductor device structure. The reticle may be created by a number of different techniques, depending on the method of writing the pattern on the reticle. Due to the dimensional requirements of today's semiconductor structures, the writing method is generally with a laser or e-beam. A typical process for forming a reticle may include: providing a glass or quartz plate, depositing a chrome-containing layer on the glass or quartz surface, depositing an antireflective coating (ARC) over the chrome-containing layer, applying a photoresist layer over the ARC layer, direct writing on the photoresist layer to form a desired pattern, developing the pattern in the photoresist layer, etching the pattern into the chrome layer, and removing the residual photoresist layer. When the area of the photoresist layer contacted by the writing radiation becomes easier to remove during development, the photoresist is referred to as a positive-working photoresist. When the area of the photoresist layer contacted by the writing radiation becomes more difficult to remove during development, the photoresist is referred to as a negative-working photoresist. Advanced reticle manufacturing materials frequently include combinations of layers of materials selected from chromium, chromium oxide, chromium oxynitride, molybdenum, molybdenum silicide, and molybdenum tungsten silicide, for example.

As previously mentioned, the reticle or photomask is used to transfer a pattern to an underlying semiconductor substrate masking layer, which is often referred to as a photoresist. Blanket irradiation passes through open areas of the reticle onto the surface of the photoresist. The photoresist is then developed and used to transfer the pattern to an underlying semiconductor structure. Due to present day pattern dimensional requirements, which are commonly less than 0.25 Φm, the photoresist is preferably a chemically amplified DUV photoresist.

A chemically amplified DUV photoresist material is commonly used in creating the reticle as well, where the pattern image in the photoresist material is created using a direct write electron beam writing tool or an optical direct write laser. Optical direct writing laser tools are available under the trade name ALTA™ from ETEC Systems Inc., Hillsboro, Oreg.

Preparation of a photomask/reticle is a complicated process involving a number of interrelated steps which affect the critical dimensions of a pattern produced in the reticle, and the uniformity of the pattern critical dimensions across the surface area of the reticle. By changing various steps in the reticle manufacturing process, the reproducibility of the manufacturing process itself may be altered, including the processing window. Processing window refers to the amount process conditions can be varied without having a detrimental outcome on the product produced. The larger the processing window, the greater change permitted in processing conditions without a detrimental affect on the product. Thus, a larger process window is desirable, as this generally results in a higher yield of in specification-compliant product produced.

The reticle manufacturing process steps generally include the following, where the initial substrate used to form the reticle is a silicon oxide-containing base layer having a layer of a metal-containing (typically chrome) mask material applied thereover. An inorganic antireflective coating (ARC) or an organic ARC, or a combination of inorganic and organic ARC layers may be applied over the surface of the chrome mask material. A photoresist layer is then applied over the antireflective coating. The photoresist is typically an organic material which is dissolved or dispersed in a solvent The solution or dispersion of photoresist is typically spin coated onto the surface of the photomask fabrication structure. Typically, the photoresist is applied over an ARC layer on the fabrication structure surface. Some of the solvent or dispersion medium is removed during the spin coating operation. Residual solvent or dispersion medium is subsequently removed by another means, typically by baking the fabrication structure, including the photoresist layer. This step is commonly referred to as "Post Apply Bake" or PAB. The photoresist is then exposed to radiation (imaged), to produce a pattern in the photoresist layer, typically by a direct write process when the pattern includes dimensions which are less than about 0.25 Φm or less. After exposure, the substrate including the photoresist layer is baked again. The second baking is typically referred to as "Post Exposure Bake" or PEB. The photoresist is then developed either using a dry process or a wet process, to create a pattern having openings through the photoresist layer thickness. Once the photoresist is "patterned" so that the pattern openings extend through the photoresist layer to the upper surface of an ARC layer, or to a surface beneath an ARC layer, the pattern in the patterned photoresist is transferred through the chrome-based mask layer and any remaining layers overlying the chrome layer, for example, typically by dry etching.

U.S. Pat. No. 6,703,169, issued Mar. 9, 2004 to Fuller et al., and titled: "Method Of Preparing Optically Imaged High Performance Photomasks", is assigned to the assignee of the present invention, and describes a method of producing a reticle via an optically imaged photoresist using a direct write continuous wave laser. In particular, the invention pertains to a method of optically fabricating a photomask using a direct write continuous wave laser, which includes the steps of applying an organic antireflection coating over a metal-containing layer; applying a chemically-amplified DUV photoresist, either positive tone or negative tone, over the organic antireflection coating; baking the DUV photoresist at a temperature within a specifically designed range under ambient conditions, with volatile removal assisted by an exhaust hood fan or by similar method (PAB); exposing a surface of the DUV photoresist to radiation from the direct write continuous wave laser; baking the developed photoresist at a temperature within a specifically designed range, again under ambient conditions using an exhausted hot plate (PEB); and, developing the image within the DUV photoresist. Preferably the laser used to image the DUV photoresist is operated at a wavelength between about 257 nm and about 198 nm, although other wavelengths may be used. Subsequently, the developed, patterned photoresist is used as a mask for transferring the pattern through a metal-containing layer of the photomask substrate. Typically the pattern transfer is by dry etch. The metal-containing layer of the photomask substrate may include combinations of layers of materials selected from chromium, chromium oxide, chromium oxynitride, molybdenum, molybdenum silicide, and molybdenum tungsten silicide, for example and not by way of limitation. This patent application is hereby incorporated by reference in its entirety.

U.S. Pat. No. 6,605,394, issued Aug. 12, 2003 to Montgomery et al., and titled: "Organic Bottom Antireflective Coating For High Performance Mask Making Using Optical Imaging", is assigned to the assignee of the present invention, and describes a reticle fabrication process, with emphasis on the bottom ARC layers used beneath the photoresist, during patterning of the photoresist. One embodiment of the invention pertains to a method of optically fabricating a photomask using a direct write continuous wave laser, which includes the steps of applying an organic antireflection coating over a metal-containing layer; applying a chemically-amplified DUV photoresist, either positive tone or negative tone, over the organic antireflection coating; and exposing a surface of the DUV photoresist to radiation from the direct write continuous wave laser. Preferably the laser is operated at 244 nm or 257 nm. The metal-containing layer may include combinations of layers of materials selected from chromium, chromium oxide, chromium oxynitride, molybdenum, molybdenum silicide, and molybdenum tungsten silicide, for example and not by way of limitation. The organic antireflection coating may be selected from a negative photoresist containing a DUV dye; a polymeric material prepared from acrylic polymers or copolymers; a binder resin combined with an acid or thermal acid generator and a photoacid generator compound; a binder resin having pendent phenyl groups; and combinations thereof. The organic anti-reflective coating composition preferably comprises acrylic polymers and/or copolymers. In an alternative embodiment of the method of fabricating a photomask, the organic antireflection-coating is applied over an inorganic antireflection coating. The inorganic antireflection coating may be selected to include a material such as chrome oxynitride, titanium nitride, silicon nitride or molybdenum silicide. This patent application is hereby incorporated by reference in its entirety.

As disclosed in the '394 patent, there are a number of problems encountered in trying to produce a photomask/reticle when the photomask pattern exhibits critical dimensions of less than 0.25 Φm (250 nm). One of the more important problem areas is the process bias which occurs, in part, as a result of the wet development of the photoresist which is used to pattern the reticle. As the developed pattern dimensions have become smaller, portions of the pattern are dissolved away during the wet development, leading to a loss in resolution in the etched thin metal-containing layer of the reticle which is patterned to produce a "hard copy" of the individual device structure pattern to be recreated on the semiconductor substrate masking layer.

Figure 1A:
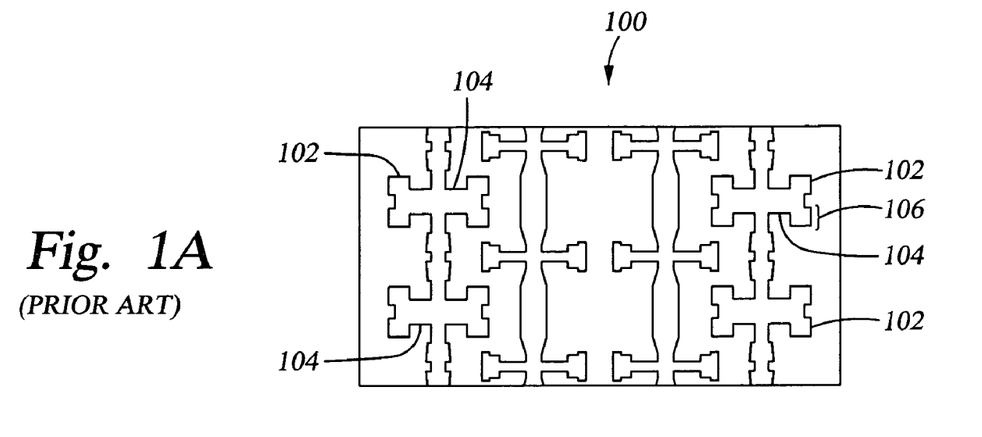
FIG. 1A shows the pattern image data which is used to draw the image 100 on a photoresist which is used to pattern a reticle.
Figure 1B:
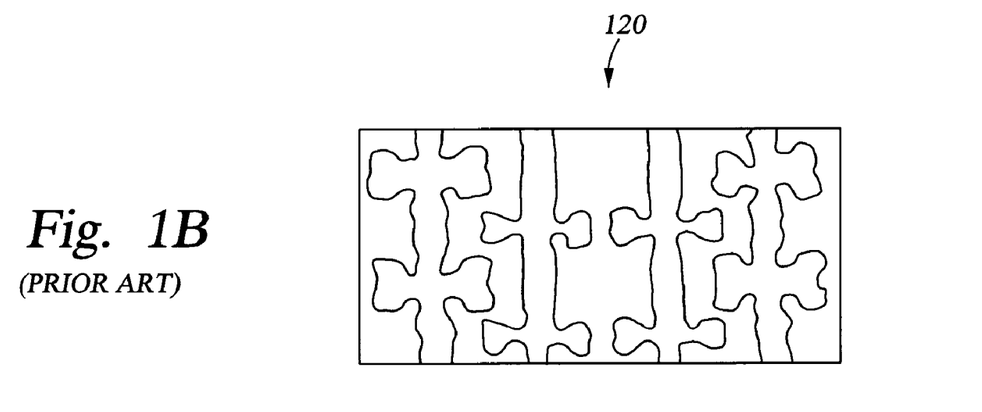
FIG. 1B shows the patterned mask/reticle features 120.
Figure 1C:
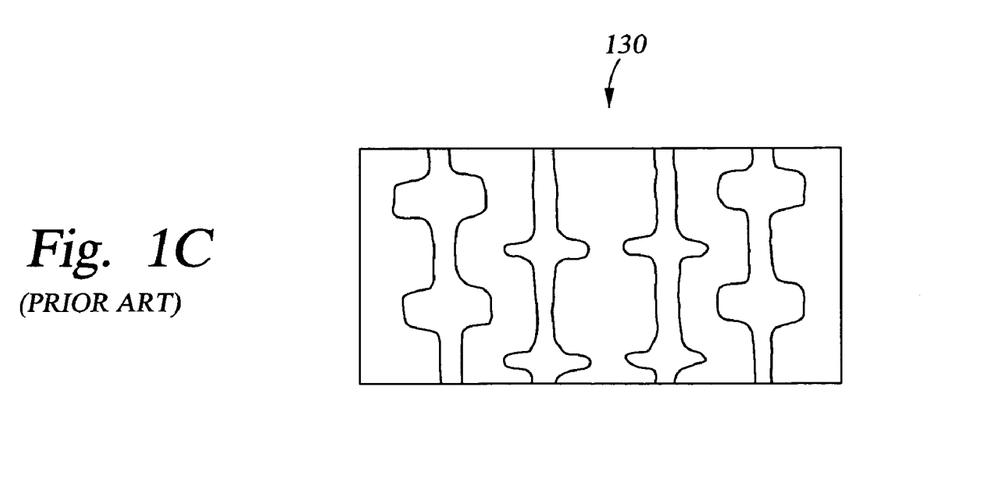
FIG. 1C shows the patterned features on a semiconductor substrate, as transferred 130 from the reticle features shown in FIG. 1A.

In an article entitled "Role of etch pattern fidelity in the printing of optical proximity corrected photomasks" by A. Kornblit et al., published in J.Vac.Sci Technol. B 13(6), November/December 1995, the authors describe optical proximity effect correction (when isolated and dense features are both present in a pattern) which is said to improve critical dimension control, increase overlay margins, and when used with phase-shifting masks and/or modified illumination and mask-plane nonprinting assist features, to also extend resolution and increase depth of focus of current generation lithographic exposure technology. Optical proximity effect correction (OPC) is described as a methodology whereby the imaging mask is intentionally distorted in an effort to partially compensate for various optical system maladies. In more recent incarnations, OPC is said to have evolved into compensation to ensure design pattern fidelity which takes into account other processing steps such as wafer etch effects. The nonprinting assist features mentioned are with respect to a fine reposition or modulation of a feature's edge so that the printed dimension is closer to the intended dimension. Examples of OPC structures are illustrated in FIG. 7 and in more detail in FIGS. 8a through 8c of the Kornblit et al. article, for example, where the pattern imaged in the photoresist is shown in FIG. 8, and the pattern as wet or dry etched into the reticle pattern transfer layer are shown in FIGS. 8a through 8c. A photoresist used to pattern a reticle may make use of assist features, which subsequently appear as part of the patterned reticle, although there may be some change in the dimensions of the assist features as a result of the processing of the reticle. When the reticle is used to transfer the pattern to a photoresist material on the surface of a semiconductor substrate, the assist features typically do not appear at all in the patterned photoresist material or only minor artifacts appear. The Kornblit et al. article shows this in FIGS. 9a through 9c, which represent the wafer prints produced using the masks shown in FIGS. 8a through 8c. The Kornblit et al.

article FIG. 8 showing the DUV data is shown as pattern 100 in FIG. 1A herein; the FIG. 8a which shows the dry etched reticle (mask) pattern layer 120 generated from the FIG. 8 pattern is shown as FIG. 1B herein; and the FIG. 9a illustration of the pattern transferred 130 into the semiconductor wafer is shown as FIG. 1C herein. The dry etched reticle Figures pertain to 4×250 nm pattern generation, i.e. a reticle pattern feature size of 1,000 nm, which translates to a 250 nm feature size on the semiconductor wafer.

Typically, for optical imaging of photoresists, the assist features are typically less than about 0.5 times the size of the target feature, in a line corner extender, for example. Currently the smallest feature which can be written using an optical continuous wave laser writing tool of the kind described herein is about 175 nm; however, at present there is no process window for this feature size which would enable a manufacturing process. The assist feature (optical proximity correction structure/OPC) for a 360 nm (manufacturable) feature size would be in the range of about 180 nm. The assist feature used at the corner of a line might then be a square 102, such as those shown at the corners of a line 104, which is presented in FIG. 1 in the present application. The square 102 would have a side dimension 106 of about 180 nm. Although it is possible to write a 180 nm latent image in the photoresist, for example a square which is 180 nm on a side, this assist feature is sufficiently small that it typically cannot be properly imaged (printed) using optical imaging techniques.

To extend the range of the optically-generated reticle to feature sizes which are below about 400 nm on the reticle, for example, there is a need for improvement in the developed photoresist patterns which are translated into the reticle pattern.

The present invention relates to improving the reticle processing window in a manner which enables patterning of smaller dimension features, and which enables better resolution of these smaller dimension features. In particular, the invention relates to an improvement in process bias and pattern resolution during the patterning of the photoresist mask which is used to transfer the pattern to the reticle.

SUMMARY OF THE INVENTION

We are able to reduce the average process bias in a patterned reticle by treating the developed, patterned photoresist which is used to transfer a pattern to the reticle with a silicon-containing reagent prior to the pattern transfer. The process bias is a measure of the difference between a nominal feature critical dimension (CD) produced in a patterned reticle and the nominal isofocal CD for the feature. Improvement of the average process bias is directly related to an improved resolution in the mask features. The reduction in average process bias achievable using the method of the invention typically ranges from about 30% to about 70%. This reduction in average process bias enables the printing of smaller features. A mask feature CD which was in the range of about 450 nm due to an average process bias of about 85 nm can be reduced to a feature CD of about 425 nm when the average process bias is reduced to about 58 nm, for example and not by way of limitation. And, a mask feature CD which was in the range of about 450 nm can be reduced to a feature CD of about 415 nm when the average process bias is reduced to about 25 nm, for example.

The improvement in average process bias is achieved by treating the developed photoresist pattern on the reticle substrate prior to dry etching of the pattern into the pattern transfer layer of the reticle. The developed photoresist pattern is treated with a silicon-containing reagent to enlarge the developed photoresist pattern on its exterior surface. The effect of the treatment is greater at pattern locations where there is increased surface area to volume, such as at the corners at the ends of lines. This helps compensate for the more rapid development and rounding of such areas during development of the photoresist pattern.

The silicon-containing reagent which is used to create an increased volume in the developed resist pattern requires the presence of —OH moieties, which are unprotected or deprotected so that they are available for reaction with the silicon-containing reagent. Typical examples of photoresist materials having such —OH groups available include photoresists comprising a binding polymer such as a novolak resin; alkylacrylate phenol polymers; and, polymers containing isobornyl units that are capable of undergoing a deprotection reaction in the present of photogenerated acid, used in combination with repeating units that contain phenolic groups, for example and not by way of limitation. Preferred polymeric binders include hydroxy styrene, styrene, t-butyl acrylate, and combinations thereof. Hydroxy phenyl repeating units in a photoresist polymeric binder may be meta, para, or ortho hydroxystyrene, for example. These hydroxy phenyl repeating units may be in combination with acrylate repeating units. The polymeric binder may also be a copolymer of isobornyl repeating units in combination with acrylate repeating units, for example. When the mask imaging process is a DUV optical process, a photoresist which employs a hydroxystyrene-based polymeric binder is preferred for transparency reasons; and, one of the more-frequently used hydroxystyrene-based resins is poly-(4-hydroxystyrene).

The silicon-containing reagents include hexamethydisilazane (HMDS); trimethylsilyldiethylamine (TMSDEA); N,N-dimethylaminotrimethylsilane (TMSDMA); 1,1,3,3-tetramethyldisilazane (TMDS), dimethylsilyldiethylamine (DMSDEA); dimethylsilyldimethylamine (DMSDMA); hexamethylcyclotrisilazane (HMCTS); bis(N,N-dimethylamino)dimethylsilane (BDADS); and bis(N,N-dimethylamino)methylsilane (BDAMS), for example and not by way of limitation. The latter three materials are polyfunctional or cyclic materials, which tend to provide a larger volume increase in the developed photoresist exterior surfaces for a given amount of silicon-containing reagent consumed during the treatment. The polyfunctional materials, such as a nitrogen substituted silanes, for example, enable crosslinking at the surface of the silylated photoresist, providing improved thermal stability of the photoresist and increased etch resistance during pattern transfer to the underlying radiation-blocking mask material (such as the metal-containing layers described herein, by way of example.)

In addition to the shape of the silicon-containing reagent affecting the volumetric increase in the photoresist dimensions, a penetration agent may be applied over the surface of the pattern developed photoresist surface prior to treatment with the silicon-containing reagent to enhance the penetration/diffusion of the silicon-containing reagent into the photoresist, to provide additional reactive sites, which enables increased volumetric growth in the pattern developed photoresist. Examples of penetrants which may be used include n-methyl pyrroledone (NMP), propylene glycol monomethyl ether acetate (PGMEA), ethyl 3-ethoxy propionate (EEP), and ethyl lactate (ethyl 2-hydroxypropionate), by way of example and not by way of limitation.

In addition to increasing the size of the developed photoresist mask features (and thereby the size of the reticle features generated from the photoresist mask), the method of the invention typically improves the etch resistance of the pattern developed photoresist during transfer of the pattern from the photoresist to the pattern transfer layer (typically comprising chrome) of the reticle. One skilled in the art will recognize that the method of the present invention can be used in combination with any direct write imaging tooling used to produce reticles, including electron beam tooling as well as continuous write laser tooling.

BRIEF DESCRIPTION OF THE DRAWINGS

FIGS. 1A through 1C show how an optical proximity effect correction (OPC) structure is used.

DETAILED DESCRIPTION OF THE INVENTION

As a preface to the detailed description, it should be noted that, as used in this specification and the appended claims, the singular forms a "an", and "the" include plural referents, unless the context clearly dictates otherwise.

As disclosed above, we have been able to reduce the average process bias in a patterned reticle by treating the developed photoresist pattern on the reticle substrate prior to dry etching of the pattern into the patterned transfer layer of the reticle. The treatment of the patterned photoresist is directly related to an improved resolution in the mask features. The reduction in average process bias achievable using the method of the invention typically ranges from about 30% to about 70% for pattern features in the size range of about 350 nm-400 nm. At least a proportional reduction in process bias is expected for smaller feature sizes. The developed photoresist pattern must contain —OH moieties which are available to react with a silicon-containing reagent, to enlarge the size of the developed photoresist pattern by adding volume toward/at the exterior surface of the developed pattern. The increase in size of a treated, patterned photoresist feature is greater at feature locations where there is a larger ratio of surface area to volume on the feature, such as the corners at the ends of lines. This increase in size of the developed photoresist feature helps compensate for the more rapid loss of feature volume during the prior development of the photoresist pattern.

The chemically amplified photoresist used in the examples presented below was a chemically amplified DUV photoresist, DX1100, supplied by AZ-Clariant Corp. of Somerville, N.J. This photoresist comprises a poly-(4-hydroxystyrene) as the primary film-forming polymer; a propylene glycol monomethyl ether acetate (PGMEA) solvent; a photoacid generator (PAG); and a latent image stabilizer (LIST), which is a photodestructable base, such as triphenylsulfonium hydroxide (TPSH).

Chemically amplified deep UV (DUV) photoresists are most commonly used in the production of devices on semiconductor wafers. However, recently the requirements for feature size on a reticle have reached critical dimensions which also require the use of chemically amplified DUV photoresists. During the evaluation of such resists for reticle manufacture, we determined that the optical proximity effect correction (OPC) structures which had been used to correct for changes in patterned photoresist dimensions during development were no longer functional. The OPC structures had become too small to print accurately. With respect to the Examples described subsequently herein, we were printing a focus/exposure pattern having vertical and horizontal members (scan and stripe) ranging from about 0.2 Φm to about 0.5 Φm.

I. Apparatus Used to Write a Pattern on the Photoresist

Figure 2:
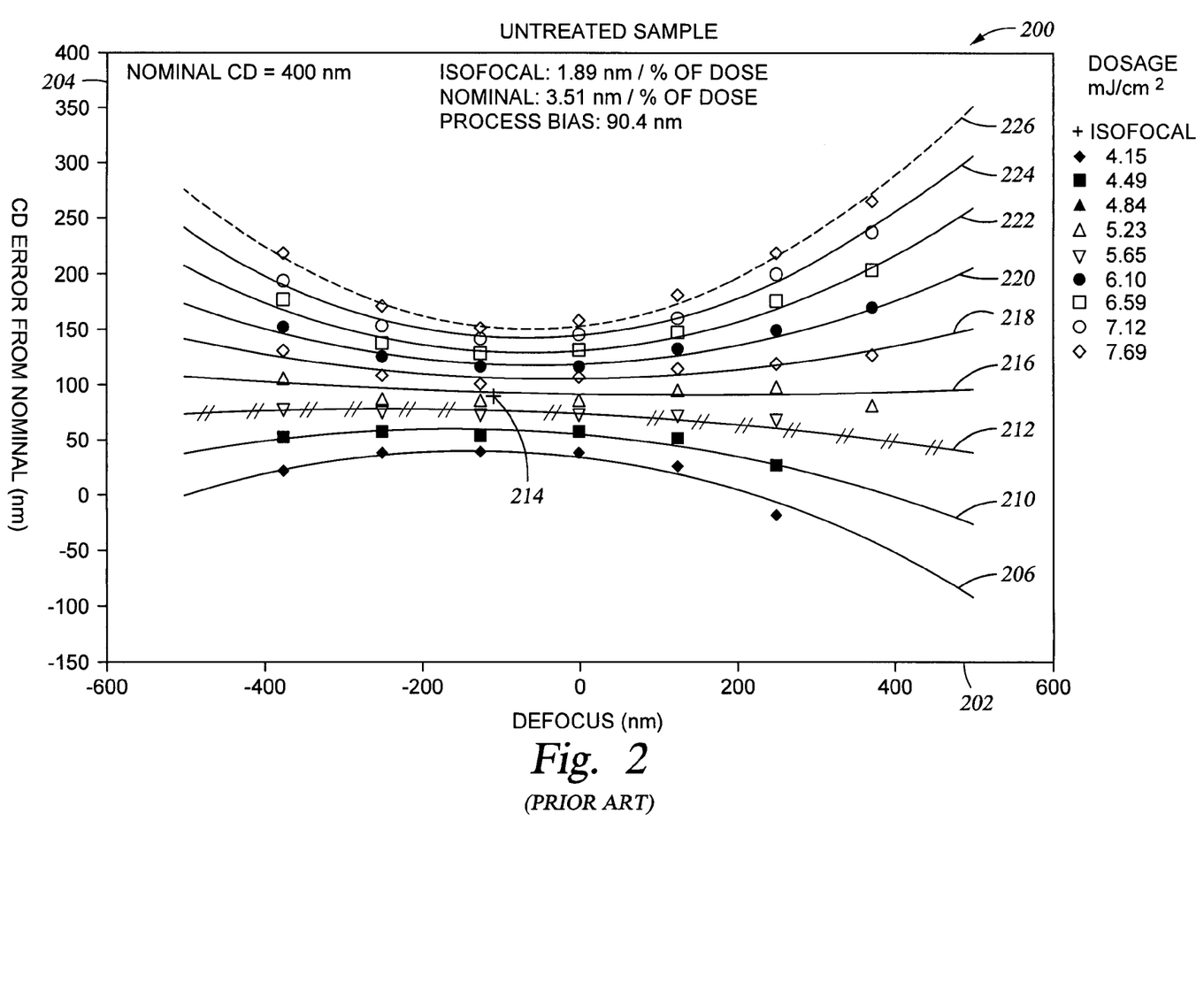
FIG. 2 shows a Bossung plot and accompanying information for a DUV photoresist generated reticle pattern on a TAR 70 layer in the reticle, where the photoresist was imaged using an ALTA X optical continuous wave laser tool operated at a wavelength of 257 nm, and the nominal feature CD was 400 nm. This data is representative of a reticle generated without the benefit of the current invention and is a comparative example.
Figure 3:
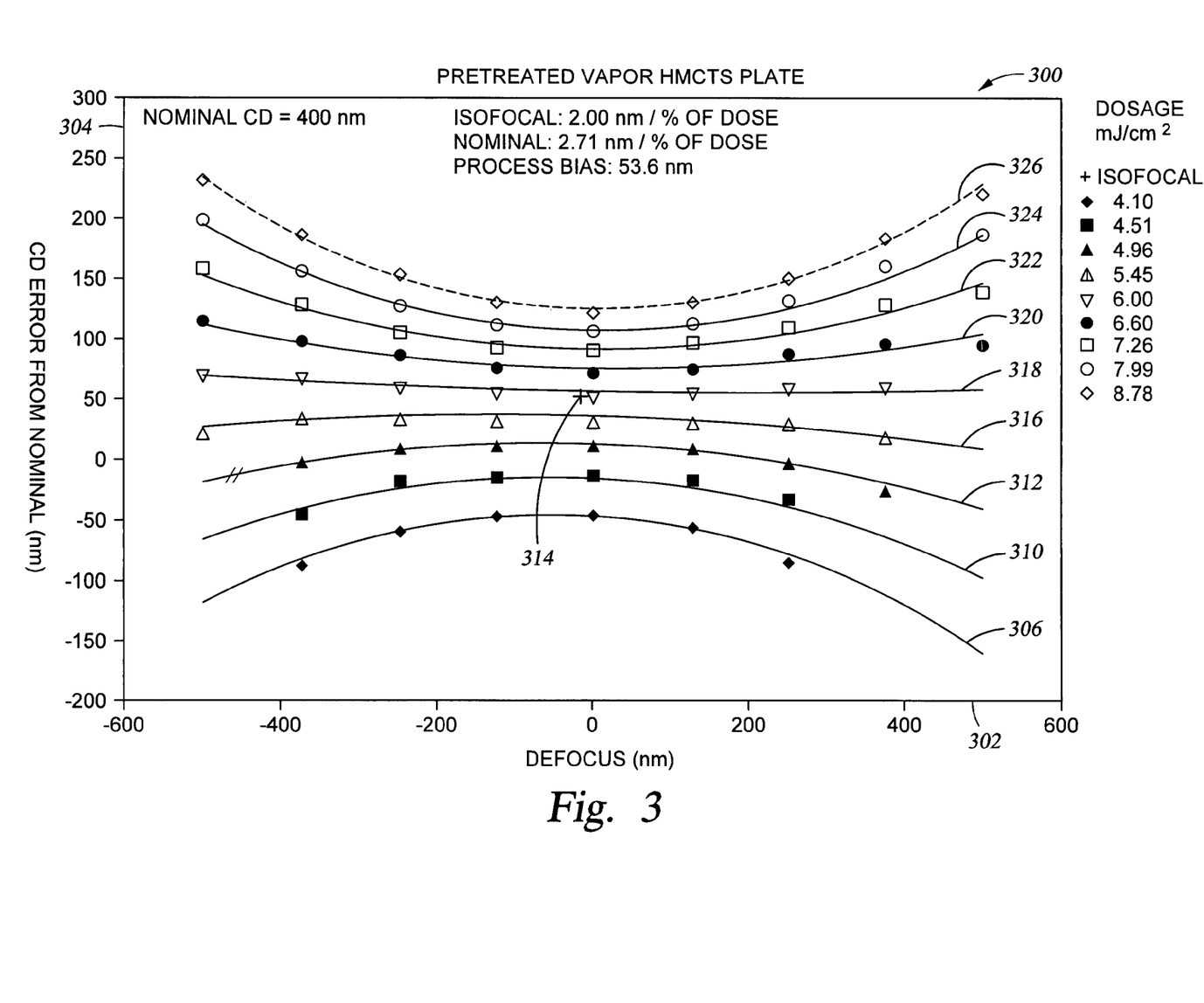
FIG. 3 shows a Bossung plot and accompanying information for a DUV photoresist generated reticle pattern on a TAR 70 layer in the reticle, where the photoresist was imaged using an ALTA X optical continuous wave laser tool operated at a wavelength of 257 nm, and the nominal feature CD was 400 nm. This data is representative of a reticle generated with the benefit of the current invention.

The imaging system which was used to write a pattern on a photoresist with respect to the experimental Examples discussed herein is a direct write continuous wave laser tool, the ALTA™ 4300, available from ETEC Systems Inc., Hillsboro, Oreg. This imaging system is illustrated in FIGS. 2 and 3. This writing tool, or a similar writing tool, is typically operated at a wavelength ranging from about 198 nm to about 257 nm wavelength. The direct write continuous wave laser tool, available under the trade name ALTA™, is a raster-scan writing system. The system contains a polygon that rotates, reflecting 32 laser beams off each facet, and scans the beams (referred to as the brush) across the substrate. The writing quality specifications for the 257 nm ALTA™ mask writing laser tool include a minimum feature size of about 400 nm (enabling the user to realize features at 50% of specification, or 200 nm). The 257 nm ALTA™ mask writing laser tool provides the user with advanced feature critical dimension (CD) control, linearity, and uniformity. However, realization of the complete performance potential in the fabricated mask depends on the use of appropriate process materials and processing methods during fabrication of the mask.

II. Method of Patterning a Reticle Including Treatment of a Developeed Photoresist with a Silicon-Containing Reagent All methods of patterning a chemically amplified photoresist (where such photoresist contains reactive —OH moieties may benefit from application of the present invention. A method of the invention is particularly useful when the application for the photoresist is in the fabrication of a reticle, where the photoresist is imaged by a direct write process.

EXAMPLES

Example One

Comparative Example

The reticle substrate which was used to prepare test specimens for the present comparative example and for Example Two (which is an embodiment of the invention), included from top to bottom:

A layer of a chemically amplified DUV photoresist, DX 1100 available from Clariant Corporation, which was spin cast upon the substrate using the procedures recommended by the DUV resist manufacturer. (Other DUV photoresists such as FEP 171, FUJI Chemical Co. (Tokyo Japan), available from ARCH™ (Santa Clara, Calif.) may be used, by way of example.) The cast film thickness was about 3450 Å thick after post apply bake (PAB). The post apply bake was carried out in a vacuum oven having an interior size of about 4 ft×4 ft×3 ft, with temperature controlled zones which are interfaced with a computer-driven system of the kind known in the art, to provide precise temperature control. Prior to the post apply bake treatment, the vacuum oven was nitrogen purged to remove air and contaminants. There was a nitrogen ambient, but no significant nitrogen flow through the oven during the post apply bake. The pressure in the vacuum chamber was atmospheric pressure during the PAB, which was carried out for a time period of about 420 seconds at about 130 EC. (Typically, the PAB is carried out over a temperature ranging from about 110 EC to about 130 EC for a time period ranging between about 7 and about 20 minutes, by way of example.).

a sputtered layer of chromium oxynitride ARC about 250 Å thick, deposited using techniques known in the art;

a sputtered layer of chrome mask material TAR (thin anti-reflective chrome) 70 about 750 Å thick, deposited using techniques known in the art; and a substrate layer of HOYA Corporations® (Tokyo, Japan) quartz, SHQ grade.

The pattern written onto the photoresist was a focus/exposure pattern (scan & stripe) test pattern which is in the shape of crosses. The pattern was written by a direct write process using the ALTA 4300 tool described above. Other optical imaging systems which employ a direct write continuous wave UV laser could be used to write the pattern. Examples include the ALTA 4000 and ALTA 4700 imaging systems. The time period required to write a test sample pattern was about 1.5 hours. (Electron beam imaging systems could also be used to write the pattern, by way of example). A post exposure bake (PEB) was carried out approximately one hour after completion of the writing of each test specimen pattern. The PEB was carried out in a temperature and ambient-controlled bake station of the kind previously described, for a time period of about 420 seconds, at a temperature of about 130 EC.

The pattern was developed using a spin/spray process with an AZ 300 MIF developer (Clariant Corporation, Sommerville, N.J.) This developer is a 2.38 wt. % solution of tetramethyl ammonium hydroxide (TMAH), of the kind generally used in the industry. The chuck holding the 6 inch square reticle, was rotated at a low speed, approximately 100 rpm, during application of the developer to create a puddle (approximately 10 seconds). Then the rotation speed was increased to about 1,000 rpm during the development process which was carried out for about 60 seconds at a temperature of about 25 EC to about 30 EC. Concurrent with cessation of develop/dispense, $CO_2$ sparged or $CO_2$ reionized water was dispensed for approximately 30 seconds at about 300 rpm spin rate for the first 15 seconds and at 1,500 rpm for the remaining 15 seconds. Further rinse via spray-puddle was commenced, followed by a spin dry-step of approximately 90-120 seconds at 2,000-2,500 rpm, in ambient air at about 30 EC. (The time of exposure of the photoresist to developer typically ranges from about 60 seconds to about 180 seconds at 25 EC to 30 EC, by way of example and not by way of limitation. The rotational speed of the chuck holding the 6 inch square reticle may be varied and typically ranges from about 100 rpm at start up to about 1,500 rpm, by way of example and not by way of limitation.) The developer was applied using a fan spray nozzle positioned about 6 inches above the surface of the reticle at approximately the 11 'o'clock position. The rate of application of developer typically ranges from about 250 ml/min to about 450 ml/min, and was about 250 ml/min for this example.

The pattern in the photoresist was then transferred to the underlying TAR chrome 70 layer using dry etch technology of the kind known in the art. In particular, a test specimen size plate, 6 inch×6 inch was processed in a TETRA® DPS™ Plus Plasma Etch System available from Applied Materials, Inc., Santa Clara Calif. This plasma processing system permits separate power application for plasma generation and for substrate biasing. Substrate biasing is used to attract ions and other high energy species from the plasma toward the substrate surface, enabling anisotropic etching. Separate application of power for plasma generation and power for substrate biasing permits separate control of the plasma density and the attractive forces (DC voltage) generated on the surface of the substrate. U.S. Pat. No. 5,753,044, issued to Hanawa et al. on May 19, 1998, contains a general description of an RF plasma reactor of the kind which permits separate power application and control for plasma generation and maintenance and for substrate biasing, by way of example and not by way of limitation.

The chrome oxynitride (inorganic ARC)/chrome mask layer etch was carried out using a plasma generated from a chlorine-oxygen-helium gas mixture. The molecular ratio of the chlorine:oxygen:helium gas mixture was about 50:10:22. The total gas flow rate was about 82 sccm. The ICP coil in the TETRA® etcher was powered to about 60 W at 2 MHz, to generate a high density plasma. The lower electrode was powered to about 5 W at about 13.56 MHz, to generate a DC voltage of about −50 V on the substrate. The temperature of the reticle plate was about 25 EC, while the wall temperature of the process chamber was about 40 EC. The etch end point was detected by optical reflectance, and occurred in about 200 seconds. Typically, higher oxygen concentrations and lower pressures cause higher mean-to-target deviation and lower selectivities, while favoring better CD uniformity. One skilled in the art can optimize the process for his/her particular apparatus.

The chrome oxynitride (inorganic ARC)/chrome mask layer etch was done using a plasma generated from a chlorine-oxygen-helium gas mixture. The molecular ratio of the chlorine:oxygen:helium gas mixture was about 33:117:10. The total gas flow rate was about 160 sccm. The ICP coil was powered to about 500 W at 2 MHZ to generate a high density plasma. The lower electrode was powered to about 5 W at about 13.56 MHZ, to generate a DC voltage of about −50 V on the substrate. The temperature of the reticle plate was about 25 EC, while the wall temperature of the process chamber was about 70 EC. The etch end point was detected by optical emission, and occurred in about 100 seconds. Typically, higher oxygen concentrations and lower pressures cause higher mean-to-target deviation and lower selectivities, while favoring better CD uniformity. One skilled in the art can optimize the process for his/her particular apparatus.

Typically the chrome layer is overetched beyond endpoint to clear residual chrome from all open regions. Generally this step is referred to as an overetch step, and is an extension of the chrome etch process described above. Longer overetch steps result in higher mean-to-target deviations. Chrome spot defect densities can be affected by the length of overetch, with lower defect densities for longer overetch processes.

After completion of the chrome layer etch, a strip and clean process was performed to remove any residual contaminants from the surface of the chrome layer. The strip chemical used was sulfuric peroxide which was heated to about 75 EC and applied over the surface of the substrate plate. After treatment with sulfuric peroxide, the substrate plate is rinsed with $CO_2$-reionized, or $CO_2$-sparged deionized water. After strip, the substrate plate was subjected to an acid clean using an industry standard 70:30 $H_2SO_4/H_2O_2$ solution, followed by another deionized water rinse. The strip step was performed on a Steag ASC 500 wet chemical processing station available from STEAG-HAMMATECH®, Santa Clara, Calif.

After completion of transfer of the pattern from the photoresist to the reticle substrate, in the manner described above, a measurement of a patterned reticle feature having a critical dimension size in the range of 400 nm was made at various points over the test specimen reticle plate surface using transmitted light and a DUV-LWM 250 LEICA® measuring tool. This provided data which illustrated the CD Error From Nominal in nm which is presented in FIG. 2 with respect to reticle patterns which were generated at various radiation dosages and optical settings on the continuous wave direct write imaging tool. Based on the data obtained for this comparative example, the process bias was 90.4 nm.

FIG. 2 shows a graph 200 (which is typically referred to as a Bossung plot) of data obtained for the comparative example test specimens. This graph 200 is peculiar to the pattern which is being imaged and to the photoresist into which the image is written. In this case, the pattern was exposure/focus, as previously mentioned. Axis 202 of the plot is the Defocus in nm, where "Defocus" indicates the amount deviation in the optical depth of focus in run from 100-125. At "0" defocus no optical focus adjustment has been made. Axis 204 of the plot shows the error in feature critical dimension (CD) in nm from a desired nominal feature size (of 400 nm) as a function of the change in optical focus for a series of different writing radiation doses in $mJ/cm^2$. Each curve represents a different writing radiation dosage, each curve representing a different test specimen. For example, at "0" defocus and a writing dosage of 7.69 $mJ/cm^2$, the feature size will be about 560 nm; while at "0" defocus and a writing dosage of 4.15 $mJ/cm^2$, the feature size will be about 440 nm. If each curve on the graph were flat, it would be possible to simply adjust the optical focus to match the dosage and obtain a given nominal feature size. However, as some of the features come more into focus at a given dosage, other features go more out of focus at that dosage for a given pattern.

The isofocal curve on the graph 200 would be a straight line, drawn horizontal at the "+" indicated by number 214. All of the features would be equally in focus on this "curve", but the nominal feature size would be about 490 nm and not the desired nominal feature size of 400 nm. For the data shown in FIG. 2, with no adjustment in optical focus, it is not possible to obtain a 400 nm nominal feature CD at any of the acceptable radiation dosages for the imaging system, except at about 4.15 $mJ/cm^2$, and there is essentially no process window for this data point, indicating that the process is not feasible. There is no combination of photoresist with radiation dosage which will produce a 400 nm nominal feature size for all of the features in the pattern.

The curve 226 illustrates feature size CD error for a dosage of 7.69 $mJ/cm^2$, where the depth of focus possible for 555±10 nm is about 275 nm. The curve 224 illustrates feature size CD error for a dosage of 7.12 $mJ/cm^2$, where the depth of focus possible for 545±10 nm is about 325 nm. The curve 222 illustrates feature size CD error for a dosage of 6.59 $mJ/cm^2$, where the depth of focus possible for 535±10 nm is about 400 nm. The curve 220 illustrates feature size CD error for a dosage of 6.10 $mJ/cm^2$, where the depth of focus possible for 525±10 nm is about 470 nm. The curve 218 illustrates feature size CD error for a dosage of 5.65 $mJ/cm^2$, where the depth of focus possible for 515±10 nm is about 575 nm. The curve 216 illustrates a relatively straight line where all features would be nearly in focus at a dosage of 5.23 $mJ/cm^2$, for a feature size of about 495 nm, where the depth of focus possible for 485±10 nm is about 700 nm. The data point 214, marked by "+" indicates the isofocal plane where a horizontal line drawn would represent a curve which has an infinite depth of focus for all feature sizes in the pattern at a feature size of about 490 nm. The curve 212 illustrates feature size CD error for a dosage of 4.84 $mJ/cm^2$, where the depth of focus possible for 485±10 nm is about 550 nm. The curve 210 illustrates feature size CD error for a dosage of 4.49 mJ/cm, where the depth of focus possible for 465±10 nm is about 400 nm. The curve 206 illustrates feature size CD error for a dosage of 4.15 $mJ/cm^2$, where the depth of focus possible for 445±10 nm is about 325 nm.

Example Two

The reticle substrate which was used to prepare test specimens for the example embodiments of the invention was the same as that used to prepare the test specimens for the comparative Example One, with the exception that the developed, patterned photoresist was treated subsequent to the spin dry cycle of the development process. The photoresist was treated with a silicon-containing reagent to add volume to the developed pattern feature size.

There are two different methods which may be used for treatment with a silicon-containing agent, a vapor phase reaction and a wet phase reaction. The data shown in FIG. 3 was for a vapor phase treatment with a silicon-containing agent. In the vapor phase reaction, the test specimen reticle plate was placed in a Y.E.S.—1224 vacuum oven, available from Yield Engineering Systems of Santa Clara, Calif. This large vacuum oven provides temperature uniformity (±2 EC). The system pumps down in the range of about 1 Torr, and purges up to nearly atmospheric pressure, using heated nitrogen ($N_2$). The process continues for several cycles, in order to remove any excess water vapor from the system. This assures temperature stabilization. Next, the silicon-containing agent, hexamethylcyclotrisiloxane (HMCTS) was introduced The HMCTS was introduced into the vacuum oven as a pure liquid, using a syringe (it would also be possible to decant the liquid into an input reservoir and to charge from the reservoir). The silicon-containing reagent was permitted to react with the developed, patterned surface of the photoresist which was present on the surface of the reticle. (Silicon-containing reagents such as hexamethydisilazane (HMDS); trimethylsilyldiethylamine (TMSDEA); N,N-dimethylaminotrimethylsilane (TMSDMA); 1,1,3,3-tetramethyldisilazane (TMDS), dimethylsilyldiethylamine (DMSDEA); dimethylsilyldimethylamine (DMSDMA); hexamethylcyclotrisilazane (HMCTS); bis(N,N-dimethylamino)dimethylsilane (BDADS); and bis(N,N-dimethylamino)methylsilane (BDAMS), and combinations of these may be used, for example and not by way of limitation. The latter three materials are polyfunctional or cyclic materials, which tend to provide a larger volume increase in the developed photoresist exterior surfaces for a given amount of silicon-containing reagent consumed during the treatment. The polyfunctional materials, such as a nitrogen substituted silanes, for example, enable crosslinking at the surface of the silylated photoresist, providing improved thermal stability of the photoresist and increased etch resistance during pattern transfer to the underlying radiation-blocking mask material, such as the metal-containing layers described herein, by way of example.) The pressure in the vacuum oven was maintained at about 700 Torr Oust below atmospheric pressure, to prevent the gas from leaking out). The reaction time period for the silicon-containing vaporous reagent was about 45 minutes at 90 EC. This reaction time period and temperature can be adjusted by one skilled in the art to provide optimal results depending on the photoresist material which is being reacted with the silicon-containing reagent. Typically, the reaction time period is in the range of about 30 minutes to about 90 minutes, at a temperature ranging from about 140 EC to about 90 EC. After completion of the reaction, the vacuum oven was evacuated to about 2 mTorr to remove unreacted silicon-containing reagent, and reaction by-products which were collected via a cold trap. After completion of the HMCTS treatment, the reticle substrate was then treated using a 5 second chlorine descum using a technique commonly known in the art, prior to taking dimensional measurements.

When a liquid phase reaction, rather than a vapor phase reaction is employed, a silicon-containing reagent treatment solution is prepared by mixing a silicon-containing reagent such as one of those named above (with reference to the vapor phase reaction) with an appropriate solvent and frequently with a penetrant. Typically, and not by way of limitation, the silicon-containing reagent is present at a concentration ranging from about 5% by volume to about 20% by volume; the solvent is present at a concentration ranging from about 80% by volume to about 95% by volume, and the penetrant is present at a concentration ranging from about 0.25% by volume to about 2% by volume. The solvent may be an unsaturated organic solvent or a saturated organic solvent. Example solvents include hexane, cyclohexane, xylene, toluene, and benzene, not by way of limitation. Combinations of solvents may be used. It is important that the solvent is essentially inert with respect to the photoresist material. The penetrant is used to increase the surface area of the photoresist which is available to react with the silicon-containing reagent. Examples of penetrant materials include n-methyl pyrrolidone (NMP), propylene glycol monomethyl ether acetate (PGMEA), ethyl 3-ethoxy propionate (EEP), and ethyl lactate (ethyl 2-hydroxypropionate), and combinations thereof. Other similar penetrants may be used. In the present instance, xylene solvent works well, in combination with about 0.5% by volume of NMP. The silicon-containing reagent treatment solution is heated to about 45 EC to about 50 EC, and the test specimen plates are submerged in the treatment solution for a time period ranging from about 10 minutes to about 15 minutes. The test specimen plates are removed from the treatment solution and rinsed in Freon to remove residual reagent and process byproducts. Drying is achieved using a nitrogen blow-dry (such as by exposing the sample to nitrogen flowing from a nozzle).

A vapor phase treatment of the developed, patterned photoresist is preferred, and this is the method which was used to prepare the test specimens which are described in detail below.

After the vapor phase treatment of the developed, patterned photoresist, the pattern was transferred from the photoresist into the reticle substrate using dry etch techniques in the manner described with respect to the comparative example.

After transfer of the pattern to the reticle substrate, a measurement of a patterned reticle feature having a critical dimension size in the range of 400 nm was made at various points over the test specimen reticle plate surface using transmitted light and a DUV-LWM 250 LEICA® measuring tool. This provided data which illustrated the CD Error From Nominal in nm which is presented in FIG. 3 with respect to reticle patterns which were generated at various radiation dosages and optical settings on the continuous wave direct write imaging tool. Based on the data obtained for this comparative example, the process bias was 53.6 nm.

FIG. 3 shows a graph 300 Bossung plot. As previously mentioned, this plot is peculiar to the pattern which is being imaged and to the photoresist into which the image is written. In this case, the pattern and photoresist were the same as previously described with respect to the comparative example. However, the photoresist was treated subsequent to development with a silicon-containing reagent in the manner described above.

Axis 302 of the plot is the Defocus in nm, where "Defocus" indicates the amount deviation in the optical depth of focus in nm from 0±100-125 nm. At "0" defocus no optical focus adjustment has been made. Axis 304 of the plot shows the error in feature critical dimension (CD) in nm from a desired nominal feature size (of 400 nm) as a function of the change in optical focus for a series of different writing radiation doses in mJ/cm$^2$. Each curve represents a different writing radiation dosage, each curve representing a different test specimen. For example, at "0" defocus and a writing dosage of 8.78 mJ/cm$^2$, the feature size will be about 525 nm; while at "0" defocus and a writing dosage of 4.10 mJ/cm$^2$, the feature size will be about 355 nm. If each curve on the graph were flat, it would be possible to simply adjust the optical focus to match the dosage and obtain a given nominal feature size. However, as some of the features come more into focus at a given dosage, other features go more out of focus at that dosage for a given pattern.

The isofocal curve on the graph 300 would be a straight line, drawn horizontal at the "+" indicated by number 314. All of the features would be equally in focus on this "curve", but the nominal feature size would be about 450 nm and not the desired nominal feature size of 400 nm. For the data shown in FIG. 3, with no adjustment in optical focus, it is possible to obtain a 400 nm nominal feature CD at a radiation dosage of about 4.75 mJ/cm$^2$. At this dosage, the depth of focus to obtain 400 nm ±10 is about 400 nm, which provides a reasonable process window.

The curve 326 illustrates feature size CD error for a dosage of 8.78 mJ/cm$^2$, where the depth of focus possible for 525±10 nm is about 340 nm. The curve 324 illustrates feature size CD error for a dosage of 7.99 mJ/cm$^2$, where the depth of focus possible for 510±10 nm is about 375 nm. The curve 322 illustrates feature size CD error for a dosage of 7.26 mJ/cm$^2$, where the depth of focus possible for 495±10 nm is about 420 nm. The curve 320 illustrates feature size CD error for a dosage of 6.60 mJ/cm$^2$, where the depth of focus possible for 470±10 nm is about 450 nm. The curve 318 illustrates feature size CD error for a dosage of 6.00 mJ/cm$^2$, where the depth of focus possible for 453±10 nm is a relatively straight line where all features would be in focus without an optical lense adjustment. This is very close to the isofocal dosage which is illustrated at 314, which would be at about 450 nm. The curve 316 illustrates a relatively straight line where all features would be nearly in focus at a dosage of 5.45 mJ/cm$^2$, for a feature size of about 435 μm, where the depth of focus possible for 435±10 nm is about 800 nm. The curve 312 illustrates feature size CD error for a dosage of 4.96 mJ/cm$^2$, where the depth of focus possible for 430±10 nm is about 450 nm. The curve 310 illustrates feature size CD error for a dosage of 4.51 mJ/cm$^2$, where the depth of focus possible for 385±10 nm is about 390 nm. The curve 306 illustrates feature size CD error for a dosage of 4.10 mJ/cm², where the depth of focus possible for 355±10 nm is about 380 nm.

Clearly the increase in volume of the developed, patterned photoresist by treatment with a silicon-containing reagent has been extremely beneficial in terms of obtainable resolution in the patterned chrome critical dimension. Not only has the process bias been reduced from 90.4 nm to 53.6 nm, but it is possible, using the method of the invention, to obtain a feature which is 385±10 nm at a radiation dosage of 4.51 mJ/cm². Although the focus sensor is dynamic with respect to the ALTA imaging systems described above, in other systems where depth of focus is more important, it is worth mentioning that the depth of focus possible in the embodiment described herein was at about 390 nm.

It is readily apparent to one skilled in the art that the treatment with the silicon-containing reagent can be optimized using penetrants and selected silicon-containing reagents. It may be possible to obtain even better results than the results described above.

The above described preferred embodiments are not intended to limit the scope of the present invention, as one skilled in the art can, in view of the present disclosure, expand such embodiments to correspond with the subject matter of the invention claimed below.

We claim:

1. A method useful in reducing the average process bias during patterning of a reticle, said method comprising:
    a) direct writing a pattern into a chemically amplified photoresist layer;
    b) developing said pattern, to provide a patterned photoresist layer, which patterned photoresist layer, after said developing, has available unprotected or deprotected hydroxyl moieties;
    c) treating a surface of said patterned photoresist layer with a silicon-containing reagent, whereby the volume of said patterned photoresist layer is increased.

2. A method in accordance with claim 1, wherein, prior to step c) said patterned photoresist layer is treated with a penetrant which increases the ability of said silicon-containing reagent to react with hydroxyl moieties present in said patterned photoresist layer, thereby increasing the amount of volume increase in said patterned photoresist layer.

3. A method in accordance with claim 1 or claim 2, where said direct writing process is an optical process.

4. A method in accordance with claim 3, wherein said direct writing is carried out using a continuous wave laser direct writing system.

5. A method in accordance with claim 1 or claim 2, wherein said average process bias, based on the pattern transferred to the reticle from the patterned photoresist layer, is improved by about 30% to about 70% over the process bias of a patterned photoresist layer which has not been treated with said silicon-containing reagent.

6. A method in accordance with claim 3, wherein said average process bias, based on the pattern transferred to the reticle from the patterned photoresist layer, is improved by about 30% to about 70% over the process bias of a patterned photoresist layer which has not been treated with said silicon-containing reagent.

7. A method in accordance with claim 4, wherein said average process bias, based on the pattern transferred to the reticle from the patterned photoresist layer, is improved by about 30% to about 70% over the process bias of a patterned photoresist layer which has not been treated with said silicon-containing reagent.

8. A method in accordance with claim 1 or claim 2, wherein the resolution of features transferred to said reticle from said photoresist layer is improved.

9. A method in accordance with claim 8, wherein a critical dimension of said features is about 400 nm or less.

10. A method in accordance with claim 8, wherein a critical dimension of said features is about 400 nm or less, and wherein the improvement in resolution permits a decrease in critical dimension ranging from about 5% to about 20%.

11. A method in accordance with claim 1 or claim 2, wherein said photoresist layer includes a binding polymer selected from the group consisting of novolak resins, alkyl acrylate phenol polymers, and polymers containing isobornyl units that are capable of undergoing a deprotection reaction in the presence of photogenerated acid, used in combination with repeating units that contain phenolic groups.

12. A method in accordance with claim 1 or claim 2, wherein said photoresist layer includes a binding polymer selected from the group consisting of hydroxy styrene, styrene, t-butyl acrylate, and combinations thereof.

13. A method in accordance with claim 1 or claim 2, wherein said photoresist layer includes a binding polymer comprising hydroxy phenyl repeating units.

14. A method in accordance with claim 1 or claim 2, wherein said silicon-containing reagent is selected from the group consisting of hexamethydisilazane (HMDS); trimethylsilyldiethylamine (TMSDEA); N,N-dimethylaminotrimethylsilane (TMSDMA); 1,1,3,3-tetramethyldisilazane (TMDS), dimethylsilyldiethylamine (DMSDEA); dimethylsilyldimethylamine (DMSDMA); hexamethylcyclotrisilazane (HMCTS); bis(N,N-dimethylamino)dimethylsilane (BDADS); bis(N,N-dimethylamino)methylsilane (BDAMS), and combinations thereof.

15. A method in accordance with claim 1 or claim 2, wherein said silicon-containing reagent is a polyfunctional reagent.

16. A method in accordance with claim 15, wherein said polyfunctional reagent is selected from the group consisting of hexamethylcyclotrisilazane (HMCTS); bis(N,N-dimethylamino)dimethylsilane (BDADS); bis(N,N-dimethylamino)methylsilane (BDAMS); and combinations thereof.

17. A method in accordance with claim 2, wherein said penetrant is selected from the group consisting of n-methyl pyrrolidone, propylene glycol monomethyl ether acetate, ethyl 3-ethoxy propionate, ethyl 2-hydroxy propionate, and combinations thereof.

18. A method in accordance with claim 1 or claim 2, where in addition to increasing the size of the developed photoresist features, etch resistance of the photoresist treated with the silicon-containing reagent is increased.

* * * * *